United States Patent [19]

Dalal et al.

[11] Patent Number: 4,485,128
[45] Date of Patent: Nov. 27, 1984

[54] BANDGAP CONTROL IN AMORPHOUS SEMICONDUCTORS

[75] Inventors: Vikram L. Dalal; M. Akhtar, both of Lawrenceville; Shek-Chung Gau, Hamilton Square, all of N.J.

[73] Assignee: Chronar Corporation, Princeton, N.J.

[21] Appl. No.: 337,627

[22] Filed: Jan. 7, 1982

Related U.S. Application Data

[63] Continuation-in-part of Ser. No. 325,585, Nov. 20, 1981.

[51] Int. Cl.³ .......................................... H01L 21/205
[52] U.S. Cl. ..................................... 427/85; 148/174; 427/86; 427/87; 427/93
[58] Field of Search ..................... 427/85, 86, 74, 87, 427/93; 148/174

[56] References Cited

U.S. PATENT DOCUMENTS

| | | | |
|---|---|---|---|
| 4,237,150 | 12/1980 | Wiesmann | 427/95 |
| 4,237,151 | 12/1980 | Strongin | 427/95 |
| 4,339,470 | 7/1982 | Carlson | 427/86 |
| 4,357,179 | 11/1982 | Adams | 427/95 |

OTHER PUBLICATIONS

Scott et al., "Deposition of a–Si:H by Homogeneous CVD" *Journal De Physique,* Collogque C4, supplanent au n°/0, Tome 42, Oct. 1981.

Primary Examiner—John D. Smith
Attorney, Agent, or Firm—George E. Kersey

[57] ABSTRACT

Method of producing amorphous semiconductor hydrides (hydrogenated amorphous semiconductors) with specified bandgaps. The desired bandgap is achieved by controlling the temperature and partial pressure of higher order semiconductanes which are created pyrolytically, for example, on a substrate using a hot-wall epitaxial reactor.

20 Claims, 7 Drawing Figures

BANDGAP CONTROL IN AMORPHOUS SEMICONDUCTORS

RELATED APPLICATION

This is a continuation-in-part of application Ser. No. 325,585 filed on Nov. 20, 1981.

BACKGROUND OF THE INVENTION

This invention relates to the production of amorphous semiconductors having a specified bandgap, and, more particularly, to amorphous silicon having such a bandgap.

Semiconductors have an extended region of discontinuity in their internal energy levels between their valence and conduction bands. This region of discontinuity is known as a "bandgap". It determines how a device made from the material will respond to external stimuli.

In order to realize the most efficient interchange or interaction between a device and its source of activation, for example, between the solar spectrum and a photo responsive device, it is advantageous to match the bandgap of the device to that of the energizing spectrum. This procedure is analogous to the matching of electrical elements in order to obtain maximum energy transfer.

Unfortunately, previously produced amorphous semiconductors have been characterised by undesirable bandgaps. It has not been possible in the case of silicon, for example, to provide bandgaps that could achieve the most efficient use of the solar spectrum with devices made with the semiconductors.

An object of the invention is to achieve precision control over the bandgaps of amorphous silicon.

SUMMARY OF THE INVENTION

In accomplishing the foregoing and related objects, the invention provides a method or preparing an amorphous semiconductor with a specified bandgap by the pyrolytic decomposition of one or more gaseous phase polysemiconductanes at a specified temperature for each desired bandgap.

In accordance with one aspect of the invention, the pyrolytic decomposition can be of a mixture of semiconductanes including a monosemiconductane and one or more polysemiconductanes.

In accordance with another aspect of the invention, the pyrolytic decomposition forms a deposit over a limited range of temperature within the total range of temperature over which the deposition can take place.

In accordance with a further aspect of the invention, the deposition takes place in a reactor which is maintained at a different temperature than the average temperature of the deposit that is formed. The deposit is desirably made on a substrate within the reactor, and the deposition temperature is substantially that of the substrate.

In accordance with yet another aspect of the invention, the temperature of the reactor is maintained at a different level than the temperature of the substrate. The reactor may be maintained at a temperature which is greater than or less than that of the reaction, with a difference in the two temperatures being maintained over the time of the reaction. The reaction desirably takes place in the temperature range between about 300° C. and 450° C. The reaction temperature can be permitted to vary within a prescribed range, which can vary between about 5 percent above and about 5 percent below the average temperature of the reaction.

In accordance with still another aspect of the invention, the semiconductanes which are pyrolytically decomposed can be diluted with an inert gase, such as argon, helium, neon, xenon or hydrogen. The semiconductanes are desirably selected from the clase of silanes, germanes and mixtures of the two. The gase from which the despost takes place can be in the form of a stream which flows continuously into and out of the reactor. The gas may be made to directly impinge on a heated substrate by, for example, the use of a directive nozzle.

Alternatively, the gas may be static within the reactor.

In accordance with a still further aspect of the invention, the gaseous medium from which the deposit takes place may include a suitable dopant. Appropriate dopants are the trihydrides or trihalides of phosphorous, arsenic and tin, as well as diborane. Organometallic compounds of aluminum and gallium may also be employed.

DESCRIPTION OF THE DRAWINGS

Other aspects of the invention will become apparent after considering several illustrative embodiments, taken in conjunction with the drawings in which.

DETAILED DESCRIPTION

Figure 1:
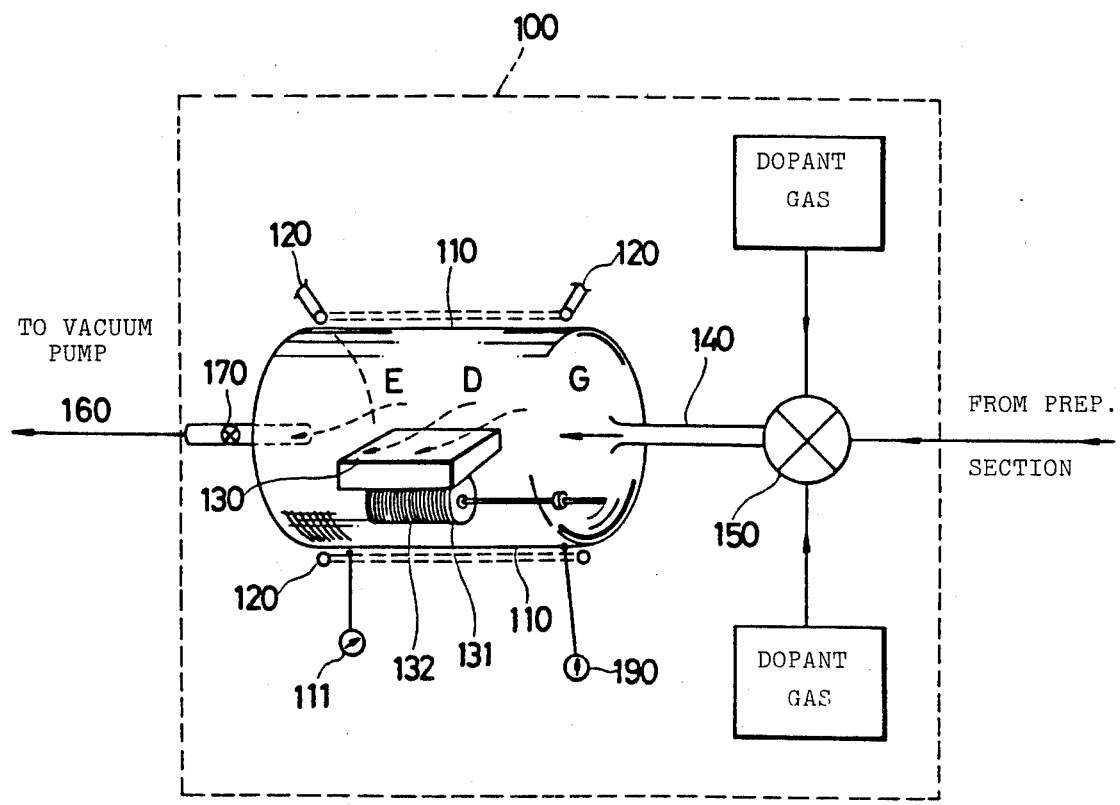
FIG. 1 is a schematic diagram of an illustrative hot-wall epitaxial reaction chamber for preparing amorphous semiconductors in accordance with the invention.

With reference to the drawings, an illustrative reaction chamber 100 for producing semiconductors with controlled bandgaps is illustrated in FIG. 1. The reaction chamber 100 is used in a process that begins with the introduction of a gaseous medium containing at least one higher order semiconductance. In the reaction chamber 100 the gaseous medium is controlled in temperature and/or pressure to bring about a pyrolytic deposit of semiconductive material having a specified bandgap.

It will be understood that the process is equally applicable to other semiconductanes, such as germanes, with the deposition temperature being adjusted according to the material that is being pyrolytically decomposed. Similiar adjustments are made in the pressure that is employed.

The reactor 100 is of the hot-wall epitaxial type, i.e., the decomposition of gases takes place at the wall of the reactor, and a deposit is formed on the substrate 130.

The wall or closure 119 of the reactor 100, typically of quartz, is surrounded over its principal cylindrical body portion by a heating coil 120. The latter is used to apply heat directly to the wall 110 and maintain it at a prescribed temperature level. This by contrast with the similar reactor 250 shown in out co-pending application Ser. No. 323,585 filed Nov. 20, 1981.

The heating effect from the coil 120 is radiated from the wall 110 onto the substrate 130. Where desired the substrate may have an additional heating effect produced by an internal heating coil 132, or a cooling effect by an internal coolant pipe 132.

The temperature of the wall is monitored by a thermocouple 111, while the temperature of the substrate is monitored by a thermocouple 131. Semiconductanes that are to be pyrolytically decomposed in accordance with the invention are introduced into the reactor 100 at an inlet 140 through an appropriate mixing valve 150. The gaseous medium is exhausted through a vacuum pump 160 through an outlet valve 170. Pressure within the chamber 100 is monitored by a gauge 180.

The pyrolytic deposit formed on the substrate 130 may be produced by either static or dynamic action of the gaseous medium. In static deposition the semiconductanes are introduced into the evacuated reactor 100 through the valve 150. The exhaust valve 170 and the inlet valve 150 are then shut, causing a specified volume of gaseous medium to be trapped in the chamber 100. Because of the heating effect of the coil 120, the trapped gas decomposes on both the wall 110 and the substrate 130. The result is a desired amorphous silicon hydride film having a specified bandgap. The static system has the advantage of economizing on the volume and pumping of the gaseous medium.

In the dynamic processing arrangement, the gaseous medium flows continuously through the chamber 100 at a desired rate determined by the settings of the inlet valve 150 and the exhaust valve 170. As a result a new reaction mixture is continuously introduced into the chamber 100 and all components of the gaseous medium maintain their relative partial pressures. The dynamic arrangement, however, has the disadvantage of some waste of the gaseous medium, since a considerably amount of the gas is exhausted through the vacuum pump 160, without decomposing to form the semiconductor deposit.

Figure 2:
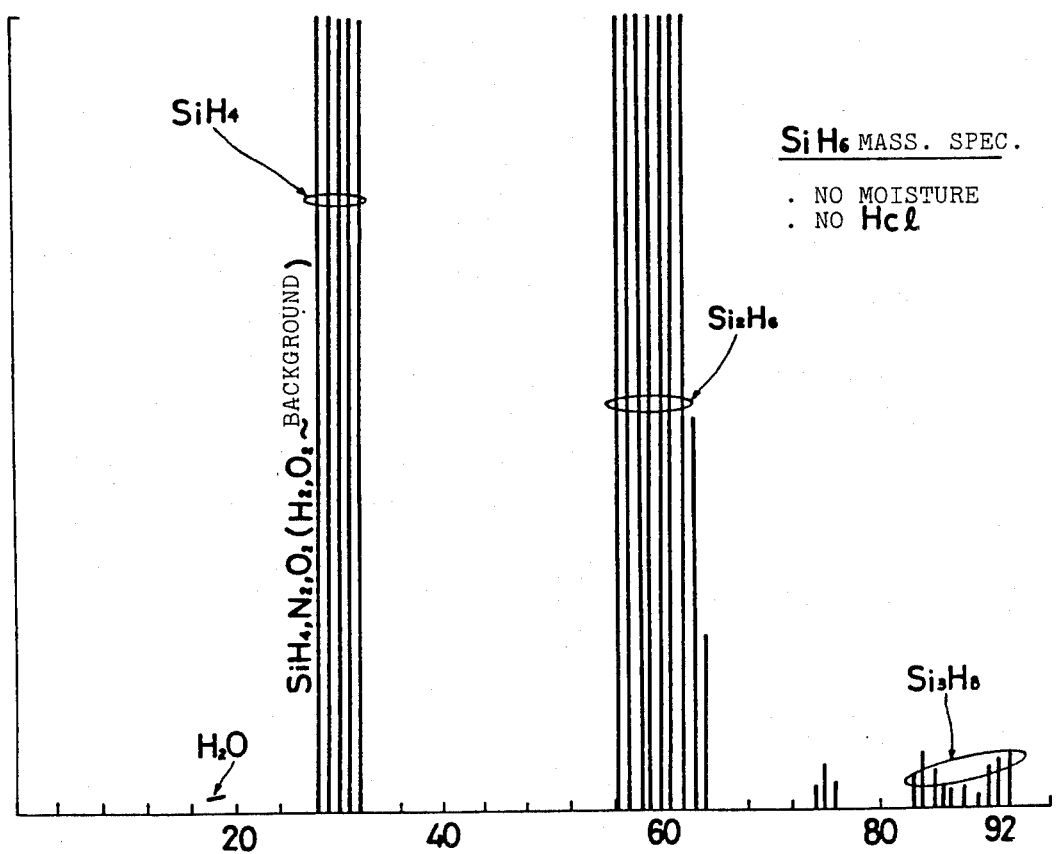
FIG. 2 is a mass-spectrometer plot of an illustrative gas mixture for preparing amorphous semiconductors in accordance with the invention.

An illustrative gaseous medium that is pyrolytically decomposed in accordance with the invention has the mass-spectrometer plot of FIG. 2. As noted from FIG. 2 the medium is a mixture of monosilanes, disilanes, and trisilanes. The monosilanes are indicated by peaks between mass numbers 28 and 34. The disilanes are indicated by peaks between mass numbers 56 and 64, while the trisilanes have peaks between numbers 84 and 93. The mass-spectrometer plot of FIG. 2 also indicates the absence of moisture and hydrogen chloride. For example, if moisture were present, it would be indicated by peaks in the vicinity of mass number 18. As is apparent, there is no indication at that particular mass number position. Since disilanes, e.g. the gaseous components peaking between mass numbers 56 and 64 are ordinarily accompanied by signficant amounts of moisture and hydrogen chloride, the mixture of FIG. 2 results from the preparation of the higher order silanes under conditions which limit the creation of impurities or results from trapping of the impurities in standard cold traps.

Figure 3:
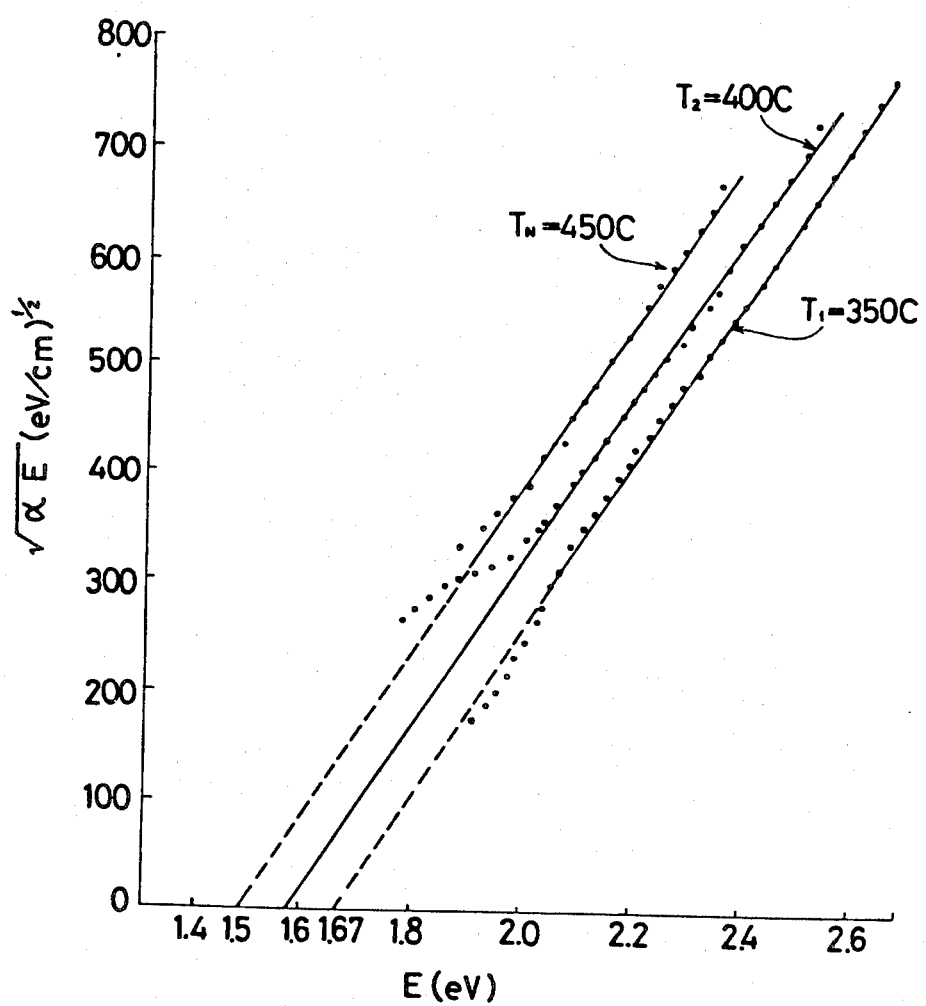
FIG. 3 is a set of parametric curves showing absorption data for amorphous semiconductors with controlled bandgaps in accordance with the invention.

When the gaseous medium of FIG. 2 is introduced into the hot-wall reactor 100 of FIG. 1 and controlled pyrolytic decomposition takes place at three different substrate temperatures, the results are as plotted in FIG. 3, where the square root of the absorption coefficient (alpha) times energy in electron volts (E) is plotted against energy. The illustrative curves $T_1$ through $T_n$, where T represents the relatively fixed temperature at which pyrolytic decomposition takes place, are shifted in the direction of lower energy, corresponding to the bandgap shift, as the temperature of the controlled deposition takes place. The curve $T_1$ for a temperature of 350° C., the curve $T_2$ for a temperature of 400° C., and the curve $T_n$ for a temperature of 450° C., all have essentially the same slope measured in terms of the ratio of the change in the square root of the absorption coeffecient times energy to the change in energy. This is significantly different from experience with glow discharge and other materials in which a significant decrease in energy gap is accompanied by a shallower slope and hence a reduced photovoltaic effect. The distinct variations in energy gap for the different temperatures of pyrolytic decomposition is attributed to the different concentrations of hydrogen that result in the deposits.

Figure 4:
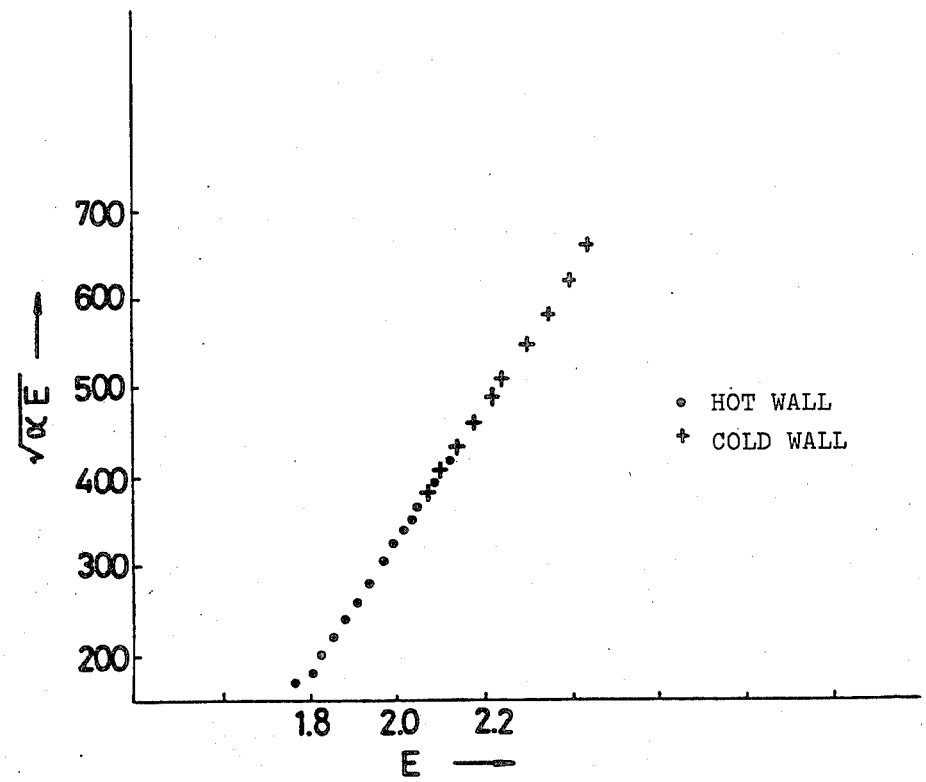
FIG. 4 is an absorption graph for films deposited in a cold-wall reactor and for a hot-wall reactor.

It is to be noted that for the plots of FIG. 3 the various readings are indicated by dots to represent absorption data for films deposited using a heated wall reactor. Substantially similar results are obtained for operations using a cold-wall reactor as indicated in FIG. 4 where the data for cold-wall operation is represented by crosses. In both cases, the temperature at which the pyrolytic decomposition takes place is about 400° C. for the substrate where the deposit forms. Both hot-wall and cold-wall deposition produce an absorption curve with a relatively constant slope.

The test results indicate that the controlling factor in determining the bandgap of the deposited material is that the substrate temperature by the same whether the reaction chamber is of the cold-wall or the hot-wall type. The substrate temperature should be maintained within ten degrees above and below the nominal value for the desired bandgap.

Figure 5:
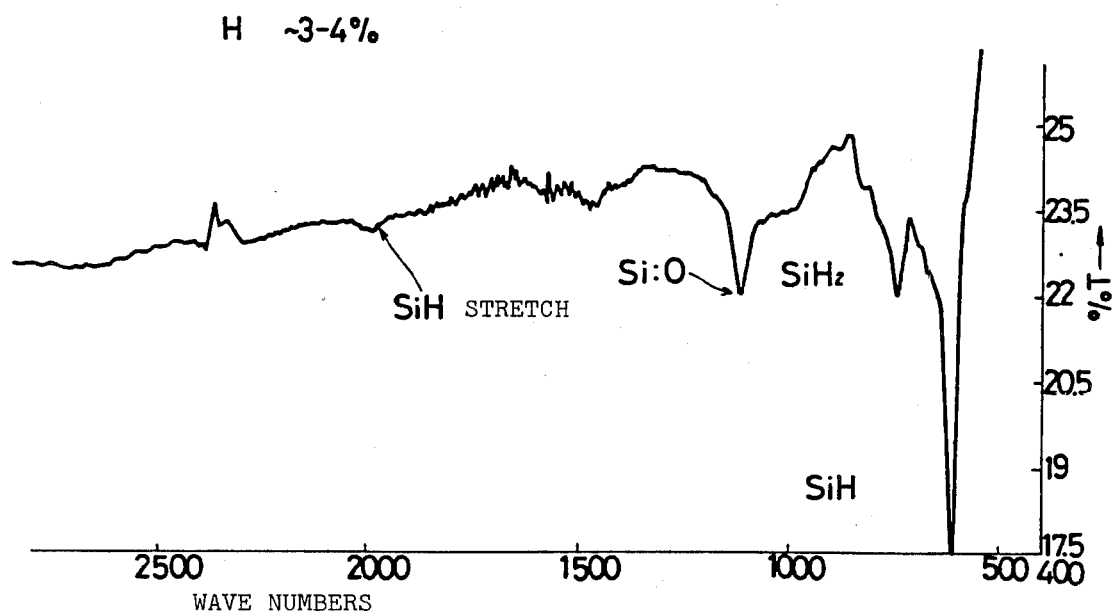
FIG. 5 is an infrared spectrum for an amorphous silicon hydride film deposited on a crystalline silicon substrate within a hot-wall reactor.

An infrared spectrum of an amorphous silicon hydride film deposited in the reactor of FIG. 1 on a cyrstalline silicon substrate is shown in FIG. 5. The spectrum has a characteristic silicon hydride stretch bond at 1980 wave numbers (reciprocal centimeters). The spectrum of FIG. 5 also indicates the absence of silicon-dihydrogen bonding. Such bonding, if present, would shift the silicon hydride peak from 1980 wave numbers toward 2100 wave numbers. The absence of such a shift in part produces the desired bandgap control of the invention. It is to be noted that the other absorption band centered at 1170 and 750 wave numbers are attributable to suitable oxide bonding in the crystalline silicon substrate and consequently play no rol in the silicon hydride that produces bandgap control in accordance with the invention.

FIG. 5 also shows a minor absorption peak at 870 wave numbers. This is likely to be substrate absorption. In any event, even if it could be associated with silicon-dihydrogen bonding, its effect would be too insignificant to adversely influence the silicon hydride that is formed.

The invention is illustrated further with reference to the following, non-limiting examples:

EXAMPLE I

A mixture of semiconductanes including monosilanes, disilanes and trisilanes was prepared. The mixture was subjected to pyrolytic decomposition in a heated-wall reaction chamber to form a semiconductor film on a silicon crystalline substrate at a temperature of about 400° C. and a pressure of 40 Torrs. The body of the reaction chamber was maintained at a fixed temperature above that of the substrate. An epitaxial film of amorphous silicon was deposited on the substrate and found to have a bandgap in the range from about 1.58 to about 1.60 electron volts.

EXAMPLE II

Example I was repeated except that the reaction chamber was maintained at a relatively constant temperature below that of the substrate. The result was substantially the same as the result for Example I.

EXAMPLE III

Example I was repeated except that the reaction chamber was unheated, and was of the cold-wall type. The results were the same as for Example I.

EXAMPLE IV

The preceeding examples were repeated except that the substrate temperature was permitted to vary in the range from about 5 percent above and 5 percent below the reaction temperature. The result was substantially the same as for Example I.

EXAMPLE V

The foregoing examples were repeated except that inert gases were used as diluents of the gaseous medium. The results were the same as before, except that the growth rates of the resulting film were lower.

EXAMPLE VI

The foregoing examples were repeated except that n-type dopant gases diluted in argon or hydrogen were introduced into the gaseous medium. The results were substantially the same as before, except that the reaction rate was slower.

EXAMPLE VII

The foregoing examples were repeated using a static gaseous medium in the reaction chamber. The results were substantially the same as for the preceeding examples.

EXAMPLE VIII

The foregoing examples were repeated varying the flow rate through the reaction chamber. The results were substantially the same as before.

EXAMPLE IX

The foregoing examples were repeated except that the substrate temperature was increased to about 450° C. and held at substantially that level during pyrolytic decomposition. The resulting amorphous silicon deposit was found to have a reduced bandgap in the range from about 1.48 to about 1.50 electron volts.

EXAMPLE X

The foregoing examples were repeated except that the temperature of pyrolytic decomposition was decreased to 350° C. The result was a substantial increase in bandgap to the level of about 1.63 to about 1.65 electron volts.

As noted above in connection with Example V the presence of monosilanes in the gaseous medium appeared to have only the effect of slowing the rate of pyrolysis. In any case, there was no adverse effect on the amorphous silicon hydride film that resulted. It is believed that the monosilanes do not participate in the decomposition since they do not decompose substantially at the test temperatures in the range from about 300° C. to about 450° C. It is apparent that if the decomposition is successfully maintained at higher temperatures where monosilanes do decompose, their presence will add to the resulting film deposit. In addition, disilane is known to decompose into silane and silicon-dihydride, so that the presence of independent silanes merely supplements the silanes that are produced by the decomposition of higher order silanes, and may slow the reaction down somewhat.

In connection with Example V, it has been noted that the addition of inert gases such as argon only affect the growth rate of the pyrolytically produced films. This comes about because there is a reduction in the partial pressure of the higher order silanes for a given total pressure. Other inert gases such as helium, neon, xenon and hydrogen have a similar effect.

Figure 6:
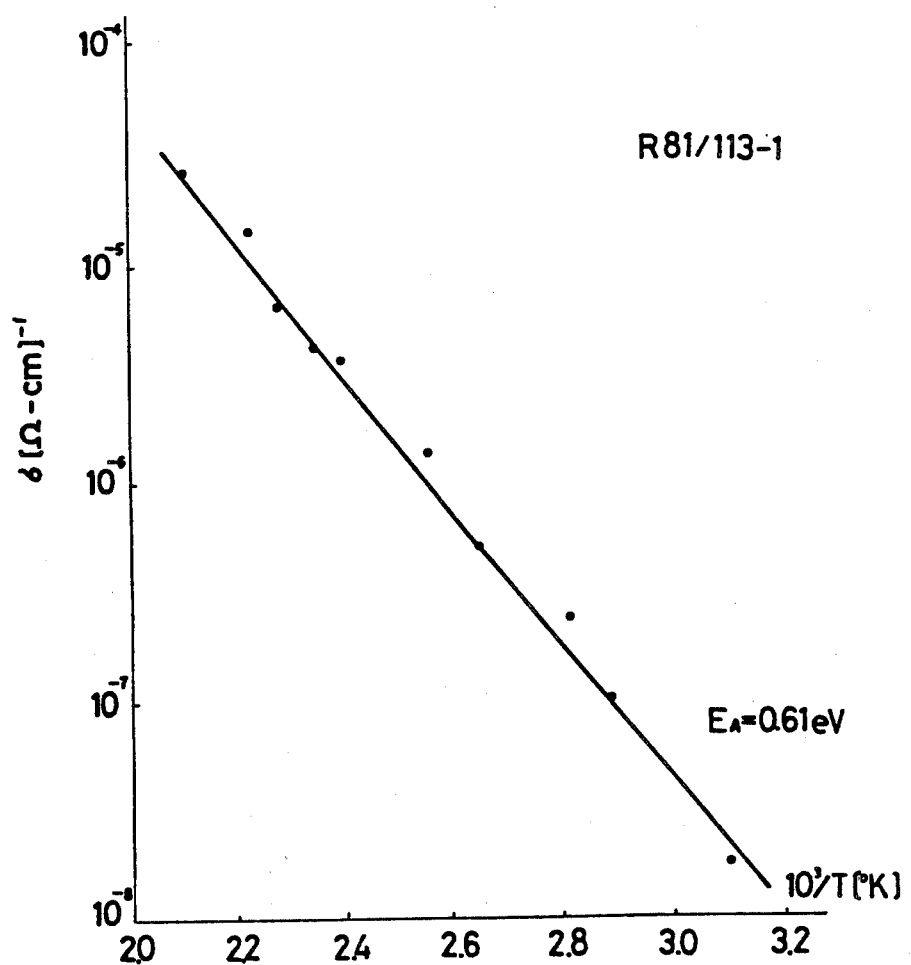
FIG. 6 is a plot of conductivity for doped deposits in accordance with the invention as a function of temperature.
Figure 7:
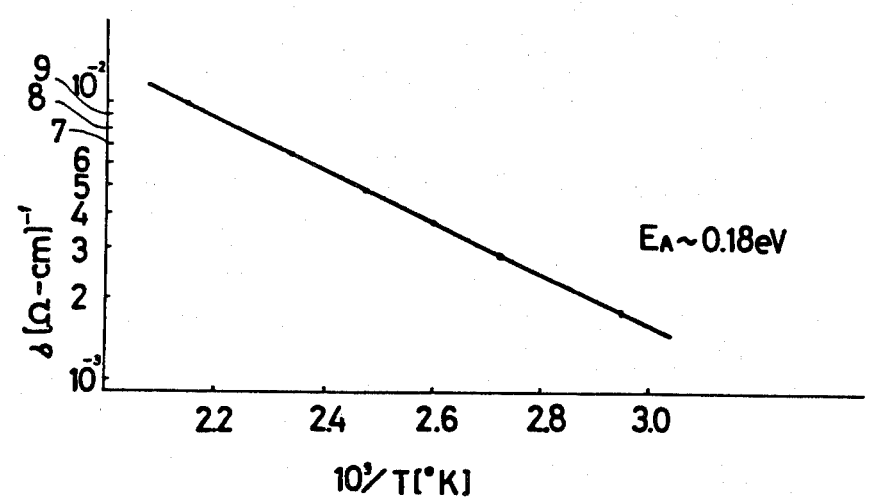
FIG. 7 is a plot of conductivity for undoped deposits in accordance with the invention as a function of temperature.

In connection with the introduction of dopants into the gaseous medium as in Example VI, FIGS. 6 and 7 compare the conductivities of n-type doped and undoped films as a function of temperature. In the case of FIG. 7, the doped film was prepared using phosphine and the gaseous medium had the approximate composition of FIG. 2, including monosilanes. As seen from FIG. 6, the conductivity of an undoped film is comparatively low and the activation energy is comparatively high, indicating that the material is intrinsic or undoped. It has a Fermi level of approximately 0.61 electron volts below the conduction band and is in fact in the middle of the bandgap. By contrast, for the doped film of FIG. 7, there is a comparatively smaller activation energy of 0.18 electron volts, indicating that the Fermi level has moved towards the conduction band as a result of the doping. Other duitable dopants, in addition to phosphine, include stibine, arsine and phosphorous trichloride for producing n-type material, and diborane, together with organometallic compounds of aluminum and gallium, for producing p-type material.

While various aspects of the invention have been set forth by the drawings and specification, it is to be understood that the foregoing detailed description is for illustration only and that various changes in parts, as well as the substitution of equivalent constitutents for those shown and described may be made without departing from the spirit and scope of the invention as set forth in the appended claims.

What is claimed is:

1. The method of producing amorphous semiconductor hydrides with specified bandgaps which comprises creating said hydrides pyrolytically on a substrate which is maintained at a first temperature within a reactor that is in turn maintained at a second temperature, by controlling the temperature and partial pressure of higher order semiconductanes.

2. The method of claim 1 wherein said higher order semiconductanes are maintained at a mean temperature in said reactor in the range from about 300° C. to about 500° C.

3. The method of claim 1 wherein the temperature of said reactor is different than that of said substrate.

4. The method of claim 1 wherein the temperature of said reactor is the same as that of said substrate.

5. The method of claim 1 wherein the temperature of said reactor is greater than that of said substrate.

6. The method of claim 2 wherein said higher order semiconductances are maintained at a mean temperature in range below about 405° C.

7. The method of claim 2 wherein said mean temperature varies within a prescribed range.

8. The method of claim 7 wherein there is a variation in temperature between about 5 percent above and 5 percent below said mean temperature.

9. The method of claim 1 wherein said semiconductanes are disilanes.

10. The method of claim 1 wherein said semiconductanes are supplemented by monosemiconductanes.

11. The method of claim 9 wherein said disilanes are supplemented by monosilanes.

12. The method of claim 1 wherein said higher order semiconductanes include a plurality of different semiconductanes.

13. The method of claim 1 wherein said semiconductanes are diluted with an inert gas.

14. The method of claim 13 wherein said inert gas is selected from the class consisting of argon, helium, neon, xenon and hydrogen.

15. The method of claim 1 wherein said semiconductor hydrides are selected from the class consisting of silicon and germanium hydrides, and alloys thereof.

16. The method of claim 1 wherein said semiconductanes are selected from the class consisting of silanes, germanes and mixtures thereof.

17. The method of claim 1 wherein said semiconductanes are included in a gaseous stream which flows continually into and out of said reactor.

18. The method of claim 1 wherein said semiconductanes are in a static gaseous atmosphere within said reactor.

19. The method of claim 1 wherein said semiconductanes are accompanied by a dopant.

20. The method of claim 19 wherein said dopant is selected from the class consisting of phosphorous trihydride, arsenic trihydride, tin trihydride, phosphorous trichloride, diborane, organometallic alloys of aluminum and gallium.

* * * * *